United States Patent [19]
Widmer et al.
[11] 3,806,810
[45] Apr. 23, 1974

[54] REFERENCE SIGNAL GENERATOR FOR PULSE CODE MODULATION

[75] Inventors: Walter Widmer, Wadenswil, Switzerland; Frank de Jager, Emmasingel, Eindhoven, Netherlands

[73] Assignee: U.S. Philips Corporation, New York, N.Y.

[22] Filed: Feb. 15, 1972

[21] Appl. No.: 226,460

[30] Foreign Application Priority Data

Feb. 26, 1971 Netherlands ........................ 7102557

[52] U.S. Cl. .................... 325/141, 325/321, 332/11, 340/347 DA

[51] Int. Cl. ........................................... H03k 13/00

[58] Field of Search .................. 325/38 R, 141, 321; 179/15 AC; 340/347 DA, 347 DD, 347 AD; 178/68; 332/11; 329/104

[56] References Cited

UNITED STATES PATENTS

| | | | |
|---|---|---|---|
| 3,594,780 | 7/1971 | Greefkes | 340/347 DA |
| 3,414,818 | 12/1968 | Reidel | 340/347 NT |
| 3,480,948 | 11/1969 | Lord | 325/38 R |
| 3,569,615 | 3/1971 | Oberbeck | 325/38 R |
| 3,518,660 | 6/1970 | Nicolas | 340/347 DD |

*Primary Examiner*—Robert L. Richardson
*Assistant Examiner*—Jin F. Ng
*Attorney, Agent, or Firm*—Frank R. Trifari; Simon L. Cohen

[57] ABSTRACT

A reference signal generator for use in the encoder and/or decoder of a pulse code modulation information transmission system with non-uniform coding, for the simultaneous generation of sequences of signal elements having quantized amplitude values and of sequences of code words characterizing the quantized amplitude values of the signal elements. The reference generator comprises a source of clock pulses, a pulse counter which is provided with a series of counting stages, a resistance-encoding network which is coupled to the counting stages of the pulse counter and to a signal output for the signal elements. The reference generator further comprises and a switching unit comprising a plurality of switching elements, each of which is associated with an individual counting stage of the pulse counter for decoupling the counting stage from the preceding counting stages and for directly coupling the source of clock pulses to the counting stage such that the latter operates as the first counting stage. A control unit is provided for actuating the switching elements according to a program.

8 Claims, 8 Drawing Figures

PATENTED APR 23 1974 3,806,810

REFERENCE SIGNAL GENERATOR FOR PULSE CODE MODULATION

The invention relates to a reference signal generator for use in the encoder and/or decoder of a pulse code modulation information transmission system with non-uniform coding, for the simultaneous generation of sequences of signal elements having quantized amplitude values and sequences of code words characterizing the quantized amplitude values of the signal elements, comprising a source of clock pulses, a pulse counter which is a provided with a series of counting stages, a switching unit which is connected between the source of clock pulses and the pulse counter, and a resistance-encoding network which is coupled to the counting stages of the pulse counter and to a signal output for the signal elements.

The reference signal generator of the kind set forth utilizes the pulse-counting principle so as the form the code. Encoders and decoders operating according to this principle are denoted as counting encoders or counting decoders, respectively. The present patent application refers exclusively to encoders and decoders of this type. In a known intrinsic non-uniform counting encoder the reference signal generator of the kind set forth is used for the uniform encoding of the signal samples in a code of, for example, 11 bits. After the uniform code has been determined, the non-uniform code is determined in this known counting encoder by means of a code conversion, the non-uniform code being, for example, a code comprising 7 bits. A drawback of this known counting encoder is the high clock pulse frequency which is required; for example, for one speech channel a clock pulse frequency of $8.2^{11}$kHz = 16 MHz is required as a theoretical minimum. Consequently, in practical systems with non-uniform coding the counting principle is used almost exclusively in combination with an analog amplitude control (compression, expansion). The advantage of the counting principle, i.e. the simple construction of the encoders and decoders in digital circuits, is then partly lost.

The invention has for its object to enable, by providing a novel concept of the reference signal generator of the kind set forth, realization of intrinsic non-uniform counting encoders and corresponding counting decoders which require a substantially lower clock pulse frequency than the known encoders and decoders.

The reference signal generator according to the invention is characterized in that the switching unit comprises a plurality of switching elements, each of which is associated with an individual counting stage of the pulse counter for decoupling the counting stage from the preceding counting stages and for directly coupling the source of clock pulses to the counting stage such that the latter operates as the first counting stage, a control unit being provided for activating the switching elements according to a program.

Figures 1, 5:
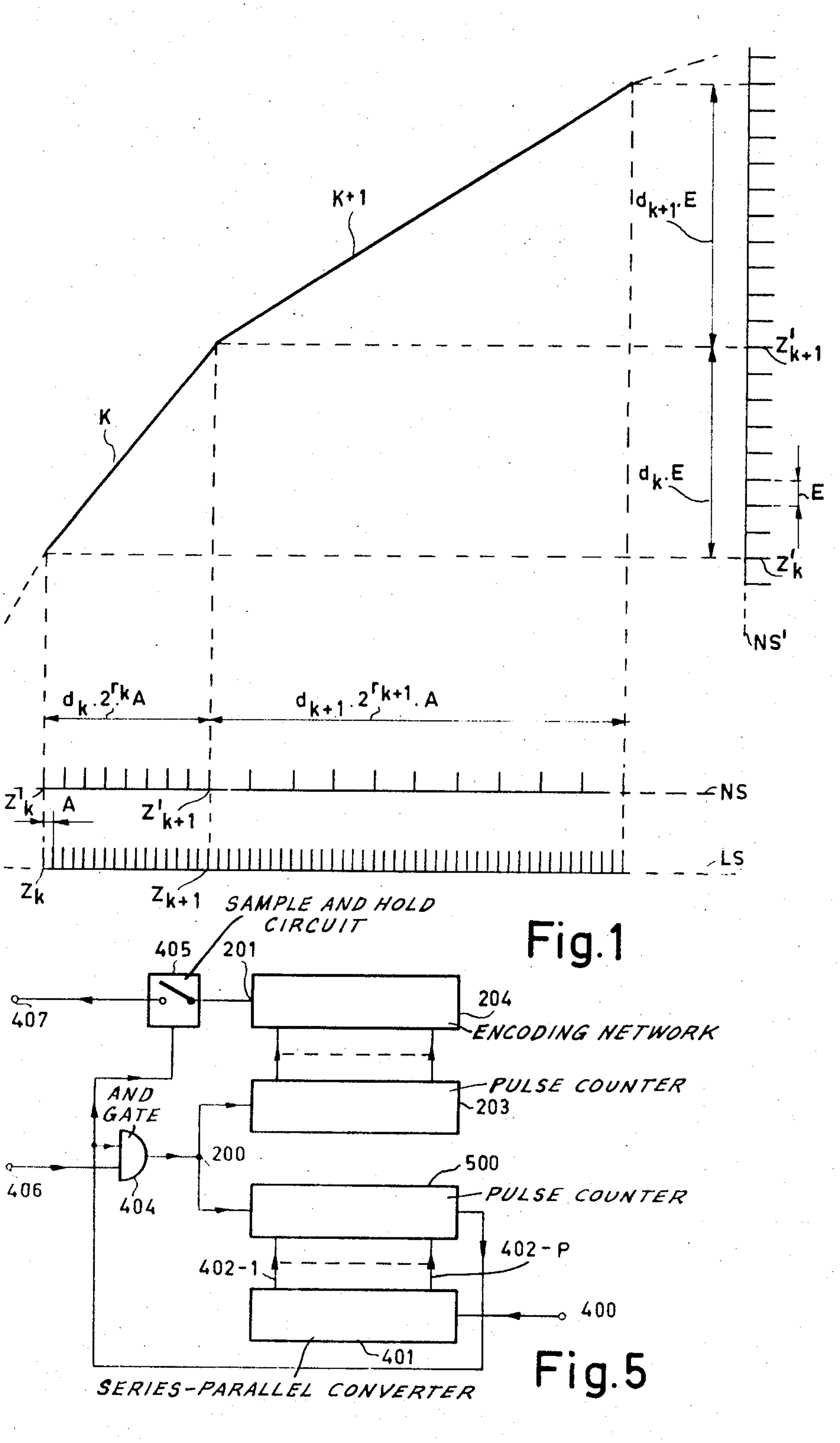
Figure 2:
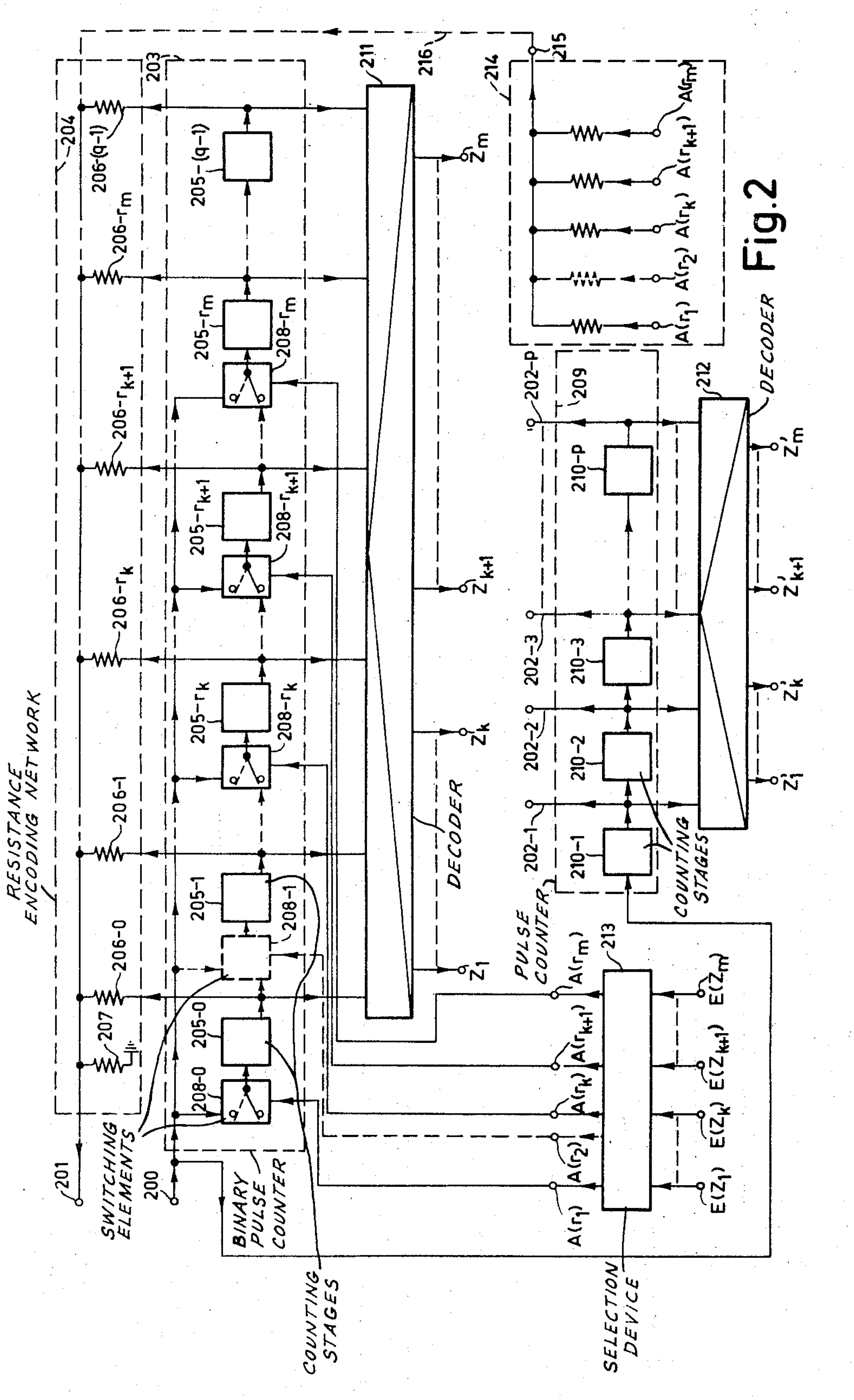
Figures 3, 4:
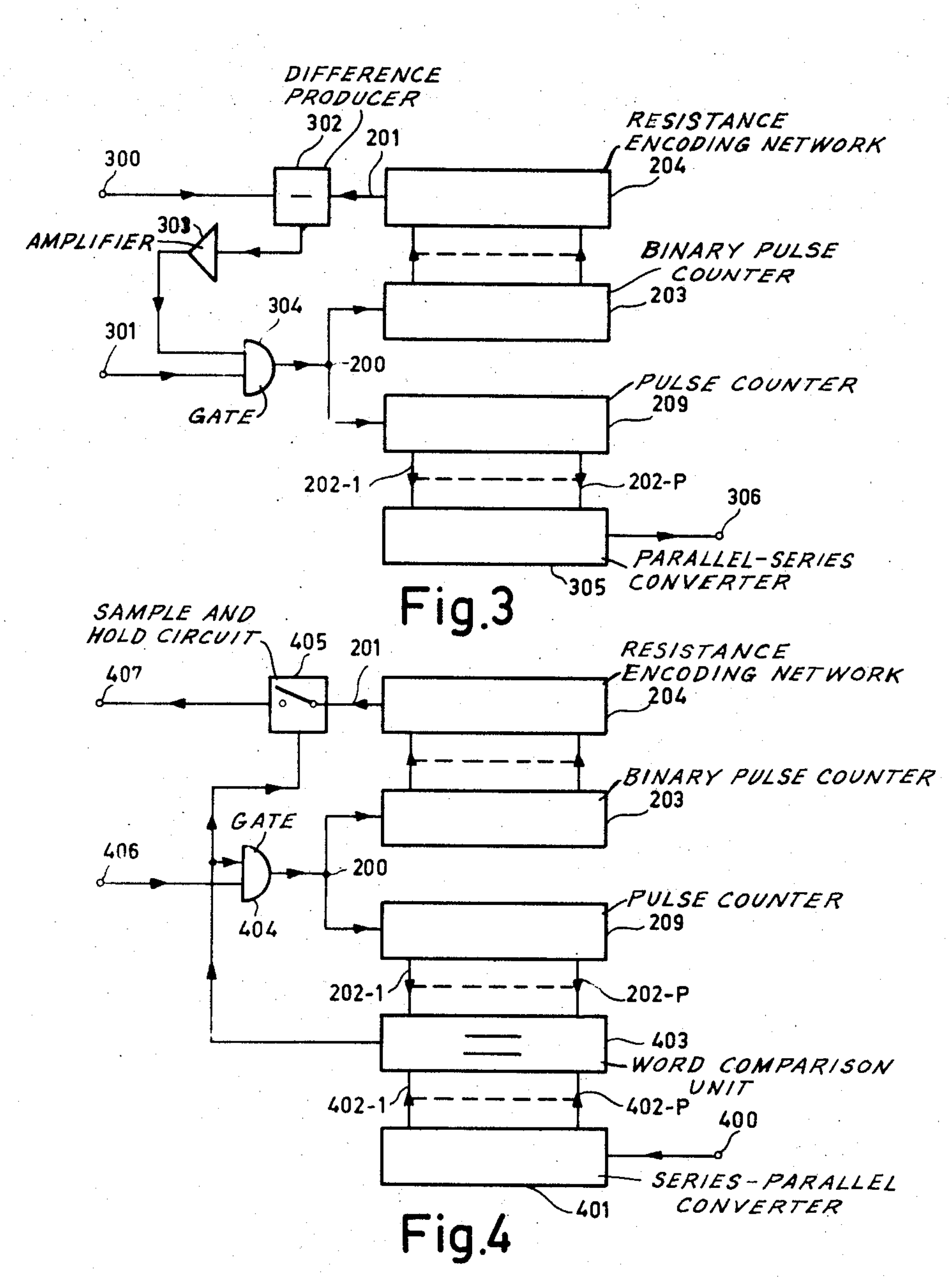
Figure 6:
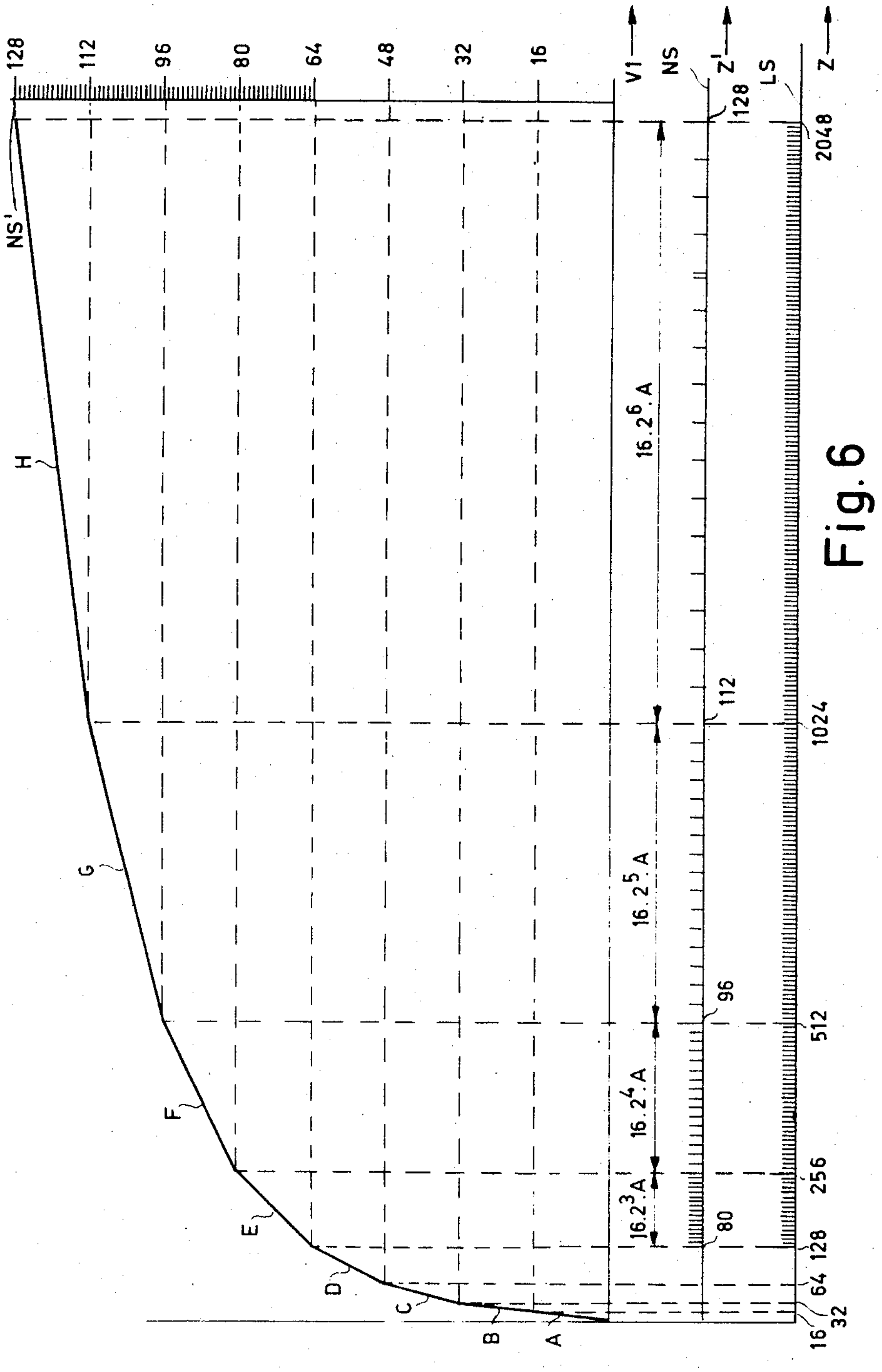
Figure 7:
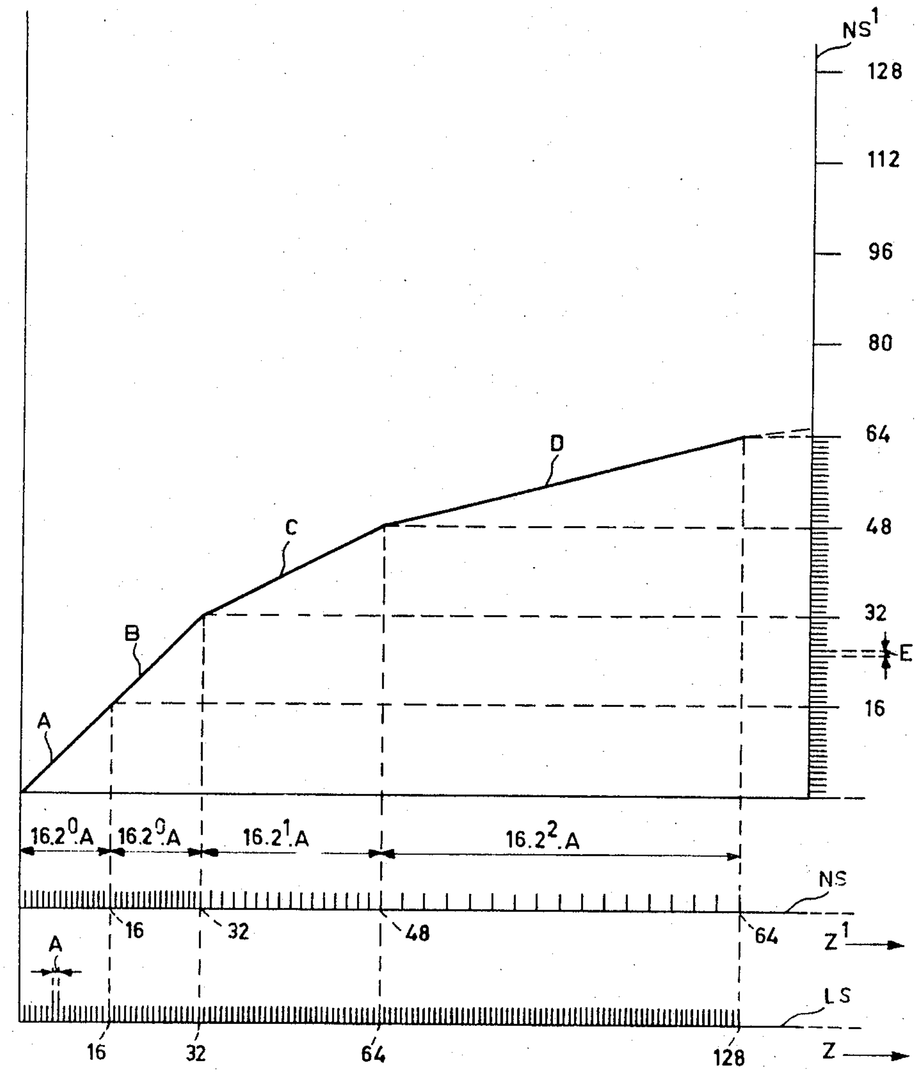
Figure 8:
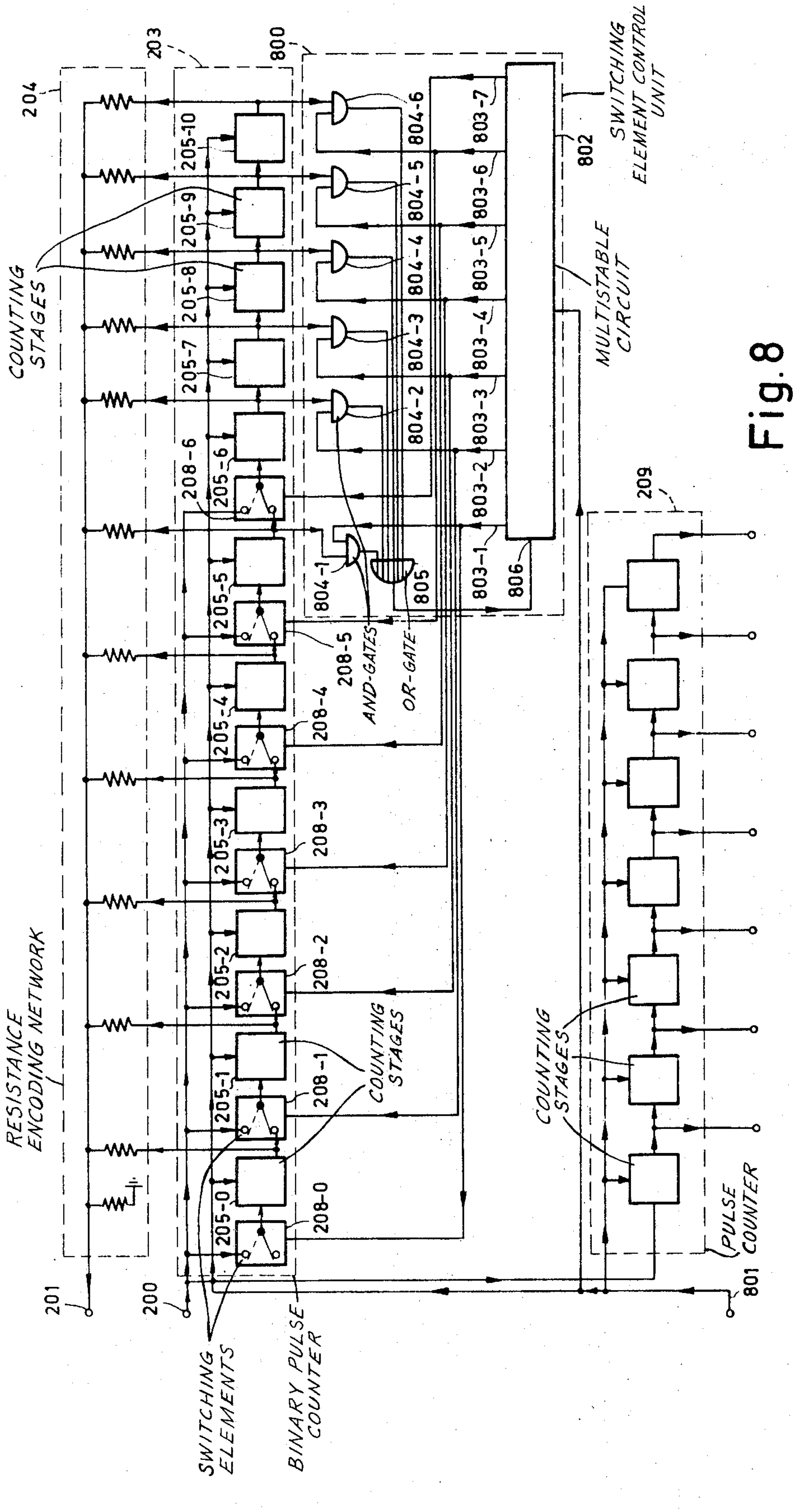

The invention and its advantages will be described in detail with reference to the Figures. Therein:

FIG. 1 shows a portion of a segmented compression characteristic,

FIG. 2 is a basic diagram of an embodiment of the reference signal generator according to the invention, FIG. 3 is the block diagram of a counting encoder in which the reference signal generator shown in FIG. 2 is used, FIG. 4 is the block diagram of a counting decoder in which the reference signal generator shown in FIG. 2 is used, FIG. 5 is the block diagram of a second counting decoder in which the reference signal generator shown in FIG. 2 is used, FIGS. 6 and 7 show a complete segmented compression characteristic, and FIG. 8 shows an embodiment of the reference signal generator according to the invention which is adapted to the compression characteristic shown in FIGS. 6 and 7.

In pulse code modulation (PCM) transmission systems quantized samples of the information signal are transmitted in the form of pulse code groups (PCM words). In order to realize compression of the information signal before transmission, use can be made of an instantaneous compressor and a uniform encoder. Another possibility is the use of an intrinsic non-uniform encoder. An encoder of this kind quantizes and codes the signal samples according to a non-uniform quantizing scale which is divided into ranges of value which are not all the same. An intrinsic non-uniform encoder, producing the same coding of the information signal as a uniform encoder which is preceded by an instantaneous compressor, causes the same compression of the information signal as the instantaneous compressor.

FIG. 1 illustrates the segments K and K + 1 of a segmented compression characteristic. Plotted along the horizontal axis is a uniform quantizing scale LS which is divided into adjacent equal ranges of value A. Plotted along the vertical axis is a uniform quantizing scale NS' which is divided into adjacent equal ranges of value E. When an instantaneous compressor having the compression characteristic shown in FIG. 1 is used, followed by a uniform encoder, the amplitude of a signal sample is converted by the compressor from the value along the horizontal axis into the corresponding value along the vertical axis. Subsequently, the quantized value of scale NS' is determined by the encoder, and a PCM word is formed characterizing the quantized value. This PCM word forms the non-uniform code of the signal sample.

The operating principle of a known intrinsic non-uniform counting encoder will be explained with reference to the non-uniform quantizing scale NS, which is plotted along the horizontal axis in FIG. 1. This scale has been formed by projecting the uniform quantizing scale NS' on the horizontal axis via the compression characteristic. The ranges of value of the non-uniform quantizing scale NS are mutually equal only in the segments of this scale which coincide with the projections of the segments of the compression characteristic on the horizontal axis. In a known intrinsic non-uniform counting encoder a signal sample is quantized according to the uniform scale NS and a PCM word is generated which characterizes this quantized value. This PCM word forms the uniform code of the signal sample. Each range of value of the scale LS corresponds to a range of value of scale NS which is characterized by the same PCM word as the range of value of NS' scale corresponding therewith. This PCM word forms the desired non-uniform code of the signal sample. The formation of the PCM word, characterizing the range of value of scale NS, from the PCM word characterizing the range of value of scale LS, is effected by a code conversion. For special segmented compression characteristics a simple relationship exists between the non-uniform code and the uniform code of the signal sample. As an example can be given the segmented compression characteristic according to the CEPT standard (Conference Europeenne de Poste et Telecommunication). The non-uniform code is then formed by a portion of the uniform code. The code conversion in this case consists in the selection of a portion of the uniform code.

By using a reference signal generator according to the invention an intrinsic non-uniform counting encoder can be obtained in which the signal samples are directly quantized according to the non-uniform quantizing scale NS and in which the associated non-uniform code is directly generated. This novel concept can be used for a class of segmented compression characteristics which will be defined hereinafter. The segment of scale NS′ which is the projection of segment K of the compression characteristic comprises $d_k$ ranges of value E. The segment of scale NS which is the projection of segment K comprises $d_k \cdot 2^{r_k}$ ranges of value A. The said class is formed by all segmented compression characteristics comprising $m$ segments, for which $d_i$ and $r_i$, where $i = 1,2, \ldots, m$, are integers. In the example of FIG. 1, $d_k = 8$, $r_k = 1$ and $d_{k+1} = 10$, $r_{k+1} = 2$. If the quantized values are coded by binary numbers of $p$ bits in the non-uniform coding, the number of ranges of value E of quantizing scale NS′ is equal to $2^p - 1$, so that for the said class the additional condition $$\sum_{i=1}^{m} d_i \leq 2^p - 1$$

is applicable. The additional condition $$\sum_{i=1}^{m} d_i \cdot 2^{r_i} \leq (2^q - 1)$$

applies if the quantized values of the quantizing scale LS are coded by binary number of $q$ bits. The dynamic range along the vertical axis then extends from zero to $\Sigma\, d_i \cdot E$ and that along the horizontal axis extends from zero to $\Sigma\, d_i \cdot 2^{r_i} \cdot A$, so that the compression factor CM is given by:

$$CM = \frac{\Sigma\, d_i \cdot 2^{r_i} \cdot A}{\Sigma\, d_i \cdot E} \qquad (1)$$

FIG. 2 illustrates the principle of an embodiment of a reference signal generator operating according to the novel concept. Terminal 200 is an input terminal for clock pulses and terminal 201 is an output terminal for signal elements having non-uniformly quantized amplitude values. The terminals 202–1, 202–2, 202–3, - - -, 202–p are the output terminals for the PCM words. Each of these PCM words forms the code of the non-uniformly quantized amplitude value of the signal element, which appears simultaneously with the PCM word. When clock pulses are successively applied to input terminal 200, a sequence of signal elements of increasing non-uniformly quantized amplitude values according to the non-uniform quantizing scale NS of FIG. 1 appears on output terminal 201. Simultaneously, a sequence of PCm words appears on the group of output terminals 202–1, 202–2, 202–3, - - -, 202–*p*.

The reference signal generator shown in FIG. 2 comprises a binary pulse counter 203 and a resistance-encoding network 204 which is coupled to this pulse counter and to the output terminal 201. The pulse counter 203 comprises a series of $q$ cascade-connected binary counting stages 205–0, 205–1, - - -, 205–(*q*–1). The outputs of these counting stages are connected, via the resistors 206–0, 206–1, - - -, 206–(*q*–1), to one end of summing resistor 207 and to output terminal 201. The other end of resistor 207 is grounded. The values of the resistors 206–0, 206–1, - - -, 206–(*q*–1) relate as $2_0 : 2^{-1} : - - - : 2^{-2(q-1)}$. Resistor 207 has a small value with respect to the resistor having the smallest value: 206–(q–1). The output voltage of the binary counting stage either equals 0 volts or U = A·(R/r) volts, depending on whether the counting stage is in the 0-state or in the 1-state. It is assumed that the ranges of value A of the quantizing scale LS of FIG. 1 have a width of A volts, that resistor 206–0 has a value of R ohms, and that resistor 207 has a value of $r$ ohms. On the output terminal 201 a voltage appears having a value, in units of A volts, which is equal to the binary number indicated by the pulse counter. When the output of each counting stage is directly connected to the input of the next counting stage and the clock pulses are applied to the input of the first counting stage 205–0, each clock pulse increases the quantized amplitude value of the signal element on output 201 by the unit of A volts, so that the series of uniformly quantized amplitude values of the uniform quantizing scale LS is traversed during the successive application of clock pulses. The PCM words characterizing these amplitude values are formed by the binary numbers which are indicated by the pulse counter 203.

According to the invention, switching elements are associated with given counting stages for supplying the clock pulses directly to the input of the relevant counting stage. These switching elements are illustrated in FIG. 2 as switches having two positions, which are denoted by the reference 208–, followed by the serial number of the counting stage with which the switching element is associated. The counting stages with which a switching element is associated are determined by the choice of the compression characteristic. A compression characteristic belonging to the said class is entirely determined by the numerical series $d_i$ and $r_i$, where $i = 1, 2, 3, - - -, m$, the meaning of which was described in the foregoing. The rule to be followed is that a switching element is associated with each counting stage whose sequence number is equal to one of the $r_i$ values. Without departing from generality, it may be assumed that at least one of the $r_i$ values is zero, which means that the smallest range of value of the non-uniform quantizing scale NS of FIG. 1 is equal to the range of value A of the uniform quantizing scale LS. In this case a switching element is always associated with the first counting stage 205–0. A switching element is associated with the second counting stage 205–1 only if at least one of the $r_i$ values is one. As this need not be the case, the switching element 208–1 is represented in FIG. 2 by a broken line FIG. 2 also shows the switching elements which are associated with the counting stages 205–$r_k$, 205–$r_{k+1}$ and 205–$r_m$ in the assumption that $r_m > r_{k+1} > r_k > 1$. If $r_k = 1$ and $r_k = 2$, as is the case for the compression characteristic shown in FIG. 2, the counting stage 205–$r_k$ coincides with counting stage 205–1, and counting stage 205–$r_{k+1}$ is identical to counting stage 205–2. Each switching element is provided with two input terminals and one output terminal. The upper input terminal in FIG. 2 is connected to the input terminal 200 for the clock pulses and the lower input terminal in FIG. 2 is connected to the output of the preceding counting stage. Each switching element furthermore comprises a control terminal for receiving control signals which set the switching element to the one or to the other position.

The switching elements are controlled by a control unit according to a program. When pulse counter 203 reaches the counting position, denoted in FIG. 1 by $Z_k$ on scale LS, marking the beginning of the segment K, the switching element 208–$r_k$ is set to the position denoted by a broken line, and the switching element which was in the position denoted by the broken line is reset to the position denoted by the solid line. As a result, the clock pulses are applied directly to the input of counting stage 205–$r_k$. Each clock pulse then increases the counting position by $2^{rk}$ so that the amplitude value of the signal element on output terminal 201 increases by the value $2^{rk}$, in units of A volts, which corresponds exactly to one quantizing step in segment K of the non-uniform quantizing scale NS of FIG. 1. When the pulse counter 203 reaches the counting position $Z_{k+1}$, marking the beginning of segment K+1, the switching element 208–$r_{k+1}$ is set to the position denoted by a broken line, and the switching element 208–$r_k$ is reset to the position denoted by a solid line, and so on for the other segments. If the program is thus completed, starting at segment 1 and terminating at the end of segment $m$, a sequence of signal elements is produced on the output terminal 201, the amplitude of the said elements traversing the series of non-uniformly quantized amplitude values of the non-uniform quantizing scale NS. The PCM words which form the code of these non-uniformly quantized amplitude values can be obtained in an extremely simple manner by using a pulse counter, denoted in FIG. 2 by 209, which counts the pulses applied to pulse counter 203 in a linear manner. The pulse counter 209 comprises $p$ cascade-connected binary counting stages 210–1, 210–2, 210–3, - - -, 210–$p$. Each clock pulse increases the quantized amplitude value of the signal element on output terminal 201 by one quantizing step to the next quantized amplitude value of the non-uniform quantizing scale NS. In this way each clock pulse corresponds to one step along the scale NS. If the number of steps is counted as of the beginning of scale NS, the counting result characterizes the associated quantized value for each range of value. The binary numbers which are applied by pulse counter 209 to the group of output terminals 202–1, 202–2, 202–3, - - -, 202–$p$ then directly form the code of the quantized amplitude values of the signal elements on output terminal 201. The amplitude of the signal elements on output terminal 201 thus traverses the series of quantized amplitude values of the non-uniform quantizing scale NS under the control of the clock pulses, the pulse counter 209 generates the series of corresponding PCM words under the control of the clock pulses.

The time which is required for the amplitude of the signal elements to traverse all quantized values of the non-uniform quantizing scale NS is the cycle time of the device shown in FIG. 2. For completely traversing one cycle as many clock pulses are required as there are steps in the amplitude value. The latter number corresponds to the number of ranges of value of the non-uniform quantizing scale NS, the latter number being much smaller than the number of ranges of value of the uniform quantizing scale LS. For a given cycle time, the repetition frequency of the clock pulses in the reference signal device shown in FIG. 2 may be accordingly lower, i.e. in the relation between the number of ranges of value of the scales LS and NS, than when the signal samples are first quantized according to the scale LS.

The control unit for controlling the switching elements can be constructed in different manners. The principle of two possible constructions is shown in FIG. 2. A first possibility is to connect a decoder 211 to pulse counter 203, said decoder decoding the counting positions $Z_1$, - - -, $Z_k$, $Z_{k+1}$, - - -, $Z_m$, which mark the beginning of segment 1, - - -, segment K, segment K+1, - - -, segment $m$, respectively, on the uniform quantizing scale LS of FIG. 1. The counting position $Z_1$ may be the zero position of pulse counter 203. Another possibility is to connect a decoder 212 to pulse counter 209, said decoder decoding the counting positions $Z'_1$, - - -, $Z'_k$, $Z'_{k+1}$, - - -, $Z'_m$ which mark the starting points of the segments on the non-uniform quantizing scale NS of FIG. 1. Both versions utilize a selection device 213. This device has as many inputs E (—) as there are segments, and has as many outputs A (—) as there are $r_i$ values. If the selection device is controlled on an input E ($Z_k$) by the output $Z_k$ of decoder 211 or the output $Z'_k$ of decoder 212, the selection device selects the output A($r_k$). The outputs of selection device 213 are connected to the control inputs of the switching elements in pulse counter 203-. The output A($r_k$) is then connected to the control input of switching element 208–$r_k$. If the output A($r_k$) is selected, a signal is produced on this output which switches the switching element 208–$r_k$ to the active position. If subsequently another output is selected, the signal on output A($r_k$) is terminated and the switching element is switched back to the rest position. In FIG. 2 it is assumed that $r_1 = 0$, so that output A($r_1$) is connected to the control input of switching element 209–0.

The program of the control units described thus far is a fixed program by which a fixed compression characteristic is realized. However, it is also possible to construct selection unit 213 and decoder 211 or decoder 212 to be variable such that a selection can be made from a plurality of programs or a plurality of compression characteristics, respectively. The latter may be of advantage for adaptive transmission system in which the compression is adapted to the transmission conditions.

FIGS. 3, 4 and 5 are block diagrams of a counting encoder, a counting decoder and another counting decoder, respectively, in which the reference signal generator shown in FIG. 2 is used. Corresponding parts in the FIGS. 2, 3, 4 and 5 are denoted by the same reference numerals.

In FIG. 3 the terminal 300 is an input terminal for the signal samples and 301 is an input terminal for the clock pulses. The input terminal 300 and the output terminal 201 of encoding network 204 are connected to different inputs of a difference-producer 302. The output of difference-producer 302 is connected to an amplifier 303. The output of amplifier 303 is connected to the input of a gate 304, which is connected between input terminal 301 and input terminal 200 of pulse counter 203. The amplifier 303 reacts to the polarity of the output voltage of difference-producer 302. It is assumed that, when the amplitude of the signal sample exceeds the amplitude of the signal element on output terminal 201, the amplifier is blocked and gate 304 is conducting. The clock pulses applied to input terminal 301 then pass gate 304 and reach the input terminal 200. As a result, a sequence of signal elements having increasing quantized amplitude values are produced on output terminal 201 of encoding network 204, the sequence of the corresponding PCM words being generated on the group of output terminals **202–1, - - -, 202–*p* of pulse counter 209. At the instant that the polarity of the difference voltage of difference-producer 302 is reversed, the amplifier 303 is unblocked, thus blocking the gate 304. The PCM word which is present on the group of outputs of pulse counter 209 is then taken over by the parallel-series converter 305 for transmission via the output terminal 306.**

In the decoder shown in FIG. 4, the PCM words are received in series from on terminal 400 and are applied to a series-parallel converter 401, comprising an intermediate store, which converts the PCM words into the parallel form, stores these in the intermediate store, and applies them to the group of output terminals **402–1, - - -, 402–*p*. This group of output terminals and a group of output terminals of pulse counter 209 are connected to different groups of input terminals of a word-comparison unit 403. The output of comparison unit 403 is connected to an input of a gate 404 and a control input of a sample-and-hold circuit 405. The gate 404 is connected between an input terminal 406 for the clock pulses and input terminal 200 of pulse counter 203. The sample-and-hold circuit 405 is connected between the output terminal 201 of the encoding network 204 and an output terminal 407 for the analog information signal. At the instant that comparison unit 403 detects equality between the received PCM word and the PCM word generated by pulse counter 209, the comparison unit supplies an output signal which blocks gate 404 and which activates the sample-and-hold circuit 405. The latter then samples the signal element appearing on output terminal 201 and supplies a signal element having a prolonged duration to output terminal 407, the said signal element having the same amplitude as the sampled signal element. The signal on terminal 407** need only be filtered so as to obtain a faithful copy of the information signal applied to the encoder.

The decoder shown in FIG. 5 differs from that shown in FIG. 4 in that the word-comparison unit 403 is dispensed with and the pulse counter 209 is replaced by a known pulse counter which has a presetting facility and which counts in the reverse direction. The PCM word present in parallel form on the group of outputs **402–1, - - -, 402–*p* of the series-parallel converter 401 is fed into the pulse counter 500 for setting the counter to the counting position corresponding to the PCM word. The switching element control unit of the decoder shown in FIG. 5 is constructed according to the first embodiment described with reference to FIG. 2, i.e., making use of the decoder 211 connected to the pulse counter 203. When clock pulses are successively applied to pulse counter 500, the latter counts down from the preset counting position to the zero position. The pulse counter 203 counts in the forward direction as usual. At the instant that pulse counter 500 reaches the zero position, the signal element on output terminal 201 has reached the quantized amplitude value which is characterized by the received PCM word. At this instant pulse counter 500 supplies a signal which blocks gate 404 and which actuates the sample-and-hold circuit 405. If desired, a counter counting in the forward direction and incorporating presetting to the complement value of the received PCM word may alternatively be used for pulse counter 500.**

FIGS. 6 and 7 show the complete segmented compression characteristic according to the CEPT standard. This characteristic consists of the eight segments A, B, C, D, E, F, G and H. The segments A, B, C and D are shown again at an enlarged scale in FIG. 7 for the sake of clarity. According to the said standard the segments A and B are normally considered as individual segments, even though these segments are situated on the same straight line. Hereinafter, the segments A and B will be considered to be one segment AB. With reference to FIG. 1 and the relevant discussion, for the compression characteristic of FIG. 6:

$m = 7, \quad p = 7, \quad q = 11$ $r_i = i-1$ for $i = 1,2,3,4,5,6,7$ $d_o = 32$, $d_i = 16$ for $i = 1,2, - - -, 6$.

FIG. 8 shows the complete reference signal generator for the characteristic shown in FIG. 6. The reference signal generator shown in FIG. 8 substantially differs from the reference signal generator shown in FIG. 2 only as regards the construction of the switching element control unit. The latter is denoted in FIG. 8 by the reference 800. In FIG. 8 the other main portions are denoted in accordance with FIG. 2. The pulse counter 203 shown in FIG. 8 comprises 11 counting stages ($q = 11$) and the pulse counter 209 shown in FIG. 8 comprises seven counting stages ($p = 7$). In accordance with the said $r_i$ values, a switching element (208–0, 208–1, - - -, 208–6) is associated with each of the first 7 counting stages (205–0, 205–1, - - -, 205–6) of pulse counter 203 shown in FIG. 8. FIG. 8 also shows a reset line 801 for resetting the pulse counters 203 and 209 and the control unit 800 at the start of each cycle.

The control unit 800 comprises a multistable circuit 802 having seven stable states and for each stable state one output, 803–1, 803–2, 803–3, 803–4, 803–5, 803–6, 803–7, respectively. The output 803–1 is connected to the control input of the first switching element 280–0 of pulse counter 203, the output 803–2 is connected to the control input of the second switching element 208–1 and so on. Furthermore, output 803–1 is connected to the input of an AND-gate 804–1 which is connected between the output of the sixth counting stage 205–5 of pulse counter 203 and an input of OR-gate 805; the output 803–2 is connected to the input of an AND-gate 804–2 which is connected to the output of the seventh counting stage 205–6 and an input of OR-gate 805; and so on up to and including output 803–6. The output of OR-gate 805 is connected to the control input 806 of the multistable circuit 802.

At the start of a cycle the multistable circuit 802 is set to the first stable state by the reset signal on line 801. In this state the multistable circuit supplies a signal on output 803–1, the said switching over the first switching element 208–0 of pulse counter 203 and blocking the gate 804–1. The sixth counting stage 205–5 of pulse counter 203 switches over from the position 0 to the position 1 when the counting position Z = 32 is reached. The counting position Z = 32 marks, as appears from FIG. 6, the beginning of segment C. The 0–1 change-over of the sixth counting stage 205–5 produces, via the unblocked AND-gate 804–1 and OR-gate 805, a pulse on the input 806 of the multistable circuit 802, so that the latter is set to the second stable state. In this state the multistable circuit 802 supplies a signal on the output 803–2, said signal switching over the second switching element 208–1 of pulse counter 203 and unblocking the gate 804–2. Due to the disappearance of the signal on output 803–1, the first switching element 208–0 of pulse counter 203 is reset and the gate 804–1 is blocked. The seventh counting stage 205–6 of pulse counter 203 changes over from the position 0 to the position 1 when the counting position Z = 64 is reached. This counting position marks the beginning of segment D. The 0–1 change-over of the seventh counting stage 205–6 produces, via the unblocked AND-gate 804–2 and OR-gate 805, a pulse on the input 806 of the multistable circuit 802 so that the latter is set to the third stable state. The operation described is repeated in an analogous manner for the eighth to the eleventh counting stage inclusive of the pulse counter 203, that is to say at the beginning of the segments E, F, G and H. 9

The quantizing of the amplitude of the signal samples causes a quantizing error which is at the most equal to one quantizing step. If use is made of non-uniform quantizing according to the non-uniform quantizing scale NS shown in FIG. 6, the maximum quantizing error increases as the signal amplitude increases. The relative maximum quantizing error is constant for substantially the entire amplitude range. In the encoder according to FIG. 3, the maximum quantizing error occurs for the signal amplitudes whose value is just slightly larger than a quantized value. The smallest error is made for signal amplitudes whose value is just slightly smaller than a quantized value. The quantizing error is always in the same sense. By subtracting one half quantizing step from the original signal amplitude, followed by encoding, a signal amplitude is produced, after decoding, having a quantizing error which is positive or negative, the maximum error value being only one half quantizing step. Instead of subtracting one half quantizing step from the signal amplitude one half quantizing step may be added to the signal element of the reference signal device of the encoder shown in FIG. 3. In order to realize the latter in the correct manner for all segments of the compression characteristic, the reference signal generator shown in FIG. 2 can be extended with an encoding network 24. This network is connected between the outputs of selection unit 213 and a signal output terminal 215, which is connected, via the broken line 216, to the signal output terminal 201 of the encoding network 204. The summing resistor 207 of the encoding network 204 then also performs the function of summing resistor for the encoding network 214. The outputs of selection unit 213 are connected, via individual resistors of encoding network 214, to the output terminal 215. For example, if the quantized amplitude value of the signal element supplied by encoding network 204 is situated in segment K, output $A(r_k)$ of the selection unit carries a signal. The resistor which is connected in the encoding network 214 between the output $A(r_k)$ and the output terminal 215, and the voltage of output $A(r_k)$ can be selected to be such that the encoding network 214 in this case supplies a signal element having an amplitude value which is equal to half the quantizing step in segment K, i.e. a value of $\frac{1}{2}2^{r}k$ in units of A volts. The same applies to the other resistors of the encoding network 214.

What is claimed is:

1. A reference signal generator for use in a pulse code modulation information transmission system with non-uniform coding, for the simultaneous generation of sequences of signal elements having quantized amplitude values and of sequences of code words characterizing the quantized amplitude values of the signal elements, comprising a source of clock pulses; a pulse counter provided with a series of cascaded clock pulse counting stages; a switching unit connected between the source of clock pulses and the pulse counter, the switching unit comprising a plurality of switching element means, each of which is associated with an individual counting stage of the pulse counter for decoupling the associated counting stage from the preceding counting stages and for directly coupling the source of clock pulses to the counting stage whereby the latter operates as the first counting stage; a resistance-encoding network coupled to the counting stages of the pulse counter and to a signal output for the signal elements and a control unit for actuating the switching elements according to a predetermined program.

2. A reference signal generator as claimed in claim 1, wherein the control unit is selectively controlled by different programs.

3. A device as claimed in claim 1, further comprising a second pulse counter means for linearly counting the clock pulses applied to the first pulse counter, outputs being provided on the pulse counter for deriving the said sequences of code words therefrom.

4. A device as claimed in claim 1, wherein the program-control unit comprises a decoder connected to the first pulse counter, and a selection unit connected to the decoder and the control inputs of the switching elements.

5. A device as claimed in claim 4, wherein the decoder comprises a series of gates connected between the outputs of a series of counting stages of the first pulse counter
and a control input of the selection unit, a control input of each gate being connected to an individual output of the selection unit.

6. A device as claimed in claim 5, wherein the selection unit comprises a multistable circuit.

7. A device as claimed in claim 3, wherein the control unit comprises a decoder connected to the second pulse counter, and a selection unit connected between the decoder and the control inputs of the switching elements.

8. A device as claimed in claim 7, further comprising a resistance-encoding network coupled to the outputs of the selection unit and the signal output for the signal elements.

* * * * *

PO-1050
(5/69)

UNITED STATES PATENT OFFICE
CERTIFICATE OF CORRECTION

Patent No. 3,806,810 Dated April 23, 1974

Inventor(s) WALTER WIDMER AND FRANK DE JAGER

It is certified that error appears in the above-identified patent and that said Letters Patent are hereby corrected as shown below:

IN THE SPECIFICATION

Col. 4, line 1, "PCm" should be --PCM--;

line 14, "$2_0 : 2^{-1}:---:2^{-2(q-1)}$" should be

--$2^0 : 2^{-1}:---:2^{-1(q-1)}$--;

line 63, after "line" insert a period ( . );

Col. 9, line 25, cancel "9";

line 51, "24" should be --214--;

Signed and sealed this 10th day of September 1974.

(SEAL)
Attest:

McCOY M. GIBSON, JR.
Attesting Officer

C. MARSHALL DANN
Commissioner of Patents